United States Patent [19]

Young

[11] Patent Number: 4,888,503
[45] Date of Patent: Dec. 19, 1989

[54] CONSTANT CURRENT BIASED COMMON GATE DIFFERENTIAL SENSE AMPLIFIER

[75] Inventor: Ian A. Young, Portland, Oreg.

[73] Assignee: Intel Corporation, Santa Clara, Calif.

[21] Appl. No.: 107,179

[22] Filed: Oct. 13, 1987

[51] Int. Cl.[4] ............................ A03K 5/24; G11C 7/06
[52] U.S. Cl. ..................................... 307/530; 307/362;
365/190; 365/208
[58] Field of Search ........................ 307/530, 355, 362;
365/190, 202, 203, 205, 207, 208, 226, 227;
330/253, 257

[56] References Cited

U.S. PATENT DOCUMENTS

| | | | |
|---|---|---|---|
| 4,479,202 | 10/1984 | Uchida | 307/530 X |
| 4,658,160 | 4/1987 | Young | 307/530 |
| 4,713,797 | 12/1987 | Morton et al. | 365/208 |

Primary Examiner—Stanley D. Miller
Assistant Examiner—Timothy P. Callahan
Attorney, Agent, or Firm—Blakely, Sokoloff, Taylor & Zafman

[57] ABSTRACT

A sense amplifier circuit for sensing signals present on data lines from a memory. The differential inputs are converted to single-ended outputs by two pairs of common gate differential input transistors and a pair of active loads. The single-ended outputs are amplified by a pair of drivers and the amplified outputs are presented as balanced differential outputs of the sense amplifier. A pair of current sourcing transistors provide DC biasing current to each of the pair of input transistors, wherein the current sourcing transistors are biased to operate in a saturation region, such that voltage changes on the data lines do not cause a change in the current source to prevent signal loss to the input transistors.

20 Claims, 1 Drawing Sheet

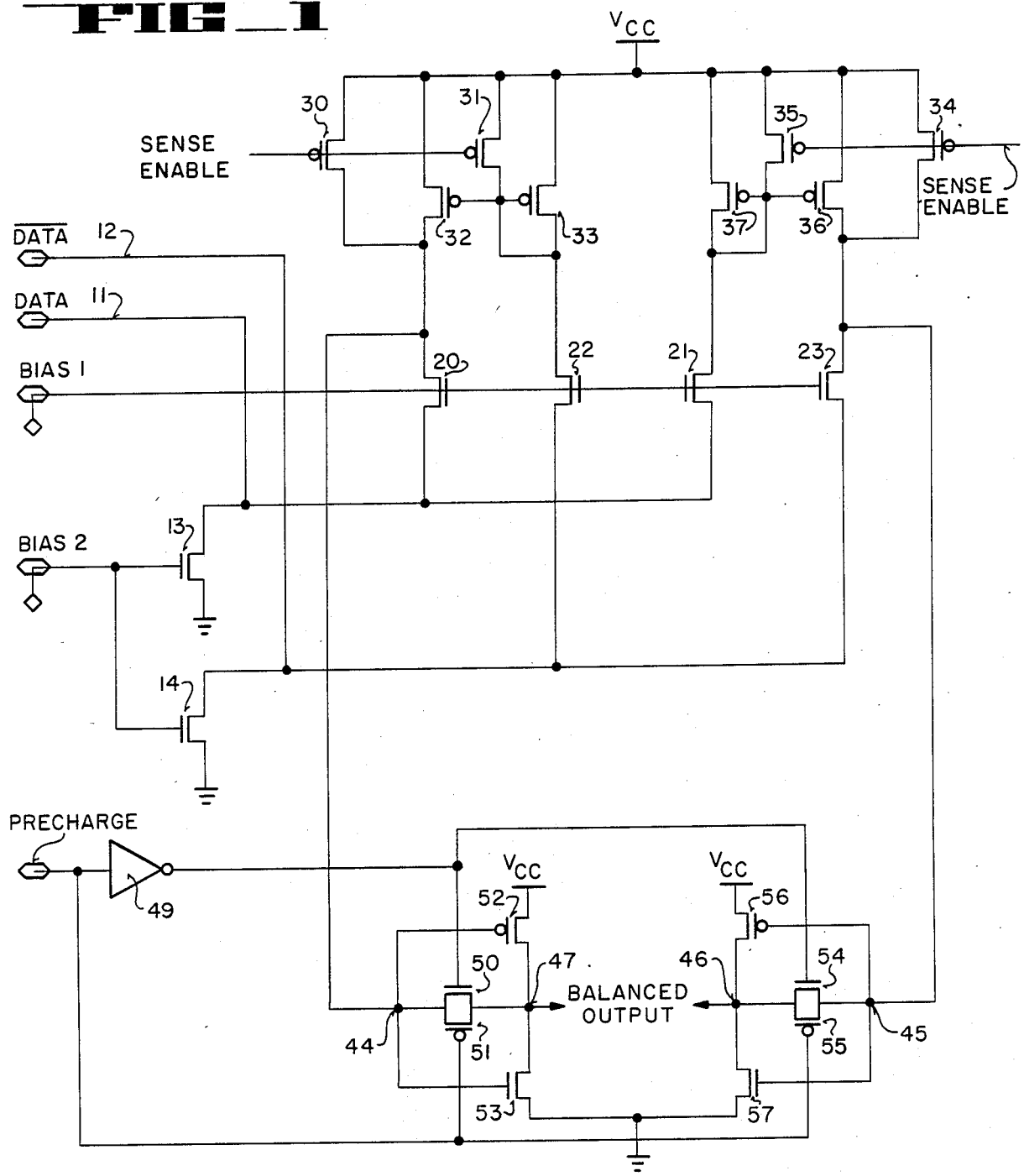
FIG_1
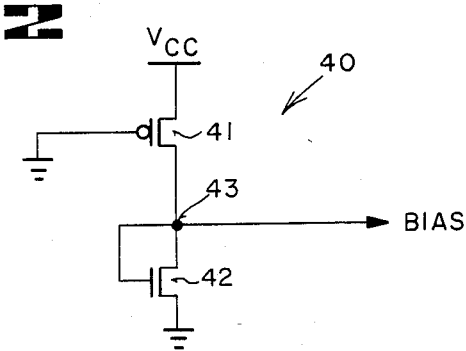
FIG_2

4,888,503

CONSTANT CURRENT BIASED COMMON GATE DIFFERENTIAL SENSE AMPLIFIER

BACKGROUND OF THE INVENTION

1. Field of the Invention

This invention relates to the field of sense amplifiers, particularly those used to sense input-output lines from a static random access memory cell.

2. Related Application

This application is related to copending application Ser. No. 065,930, filed June 24, 1987, and entitled "Folded-Cascode Configured Differential Current Steering Column Decoder Circuit".

3. Prior Art

In a typical semiconductor memory, contents of the memory are coupled to various devices for input and output of information to and from the memory. Various semiconductor memory architectures incorporate the use of sense amplifiers to read information stored in the memory cells. Initially, data is written into and stored in a memory cell. When this data is to be read from each of these memory cells, a pair of bit lines couple the memory cell to its appropriate sense amplifier. The sense amplifier reads the state of the bit lines and provides the result as an amplified signal on a distribution bus.

In a typical memory array architecture, a plurality of memory cells are arranged in a row and column matrix and normally the columns are coupled to a sense amplifier through a decoder circuit. A word line selects memory cells of a given row of an array and the decoder circuit selects a desired column to the sense amplifier.

Various sense amplifiers are available to perform this function in the prior art. However, prior art sensing schemes achieve sensing by one or more stages of common source differential amplifiers coupled to the input-output (I/O) lines. Typically, these prior art sense amplifiers require the use of level shifters and active loads which are sensitive to process variations.

A common gate MOS differential sense amplifier, which is an improvement over the prior art, is disclosed in U.S. Pat. No. 4,658,160 in which the inventor of that patent is also the current inventor of this application.

The U.S. Pat. No. 4,658,160 discloses a sense amplifier, which is an advantage over the prior art method of providing amplification for sense amplifiers. However, the U.S. Pat. No. 4,658,160 utilizes devices biased in the linear region of transistor operation and is, therefore, dependent on the voltage changes present on the data lines. It is an object of the present invention to provide an improved sense amplifier which is less sensitive to input voltage and current variations and is substantially independent of voltage changes on the data lines.

SUMMARY OF THE INVENTION

The present invention provides for a common gate differential sense amplifier which is biased by a current source operating in the saturation region such that input variation changes to the sense amplifier will not result in signal loss. The sense amplifier of the present invention is an improvement over the sense amplifier described in U.S. Pat. No. 4,658,160.

A pair of data lines from a memory decoder are each coupled to a pair of input transistors having an active load. The differential inputs are converted to a single-ended output by each pair of input transistors and their active loads.

Each single-ended output is amplified in a driver stage and the amplified output pairs provide a balanced differential output from the sense amplifier.

A current sourcing transistor is coupled to each data line and is biased to operate in the saturation region for providing substantially constant current to the input transistors. This current sourcing technique minimizes the signal loss due to voltage changes on the data line.

BRIEF DESCRIPTION OF THE DRAWINGS

FIG. 1 is a circuit schematic diagram of a sense amplifier of the present invention.

FIG. 2 is a circuit schematic diagram of a biasing scheme used with the sense amplifier of FIG. 1.

DETAILED DESCRIPTION OF THE PRESENT INVENTION

A constant current biased common gate differential sense amplifier is described. In the following description, numerous specific details are set forth, such as specific circuits and signal lines, etc., in order to provide a thorough understanding of the present invention. However, it will be obvious to one skilled in the art that the present invention may be practiced without these specific details. In other instances, well known circuits and signal lines have not been described in detail in order not to unnecessarily obscure the present invention.

The present invention is an improvement over the common gate MOS differential sense amplifier described in U.S. Pat. 4,658,160. However, the sense amplifier of the '160 patent utilized pull-up devices operating in the linear region. The current in a linearly biased device is significantly more sensitive to voltage variations than in a saturated device. This is important in the instance when the data output lines change potential. A current change through the pull-up devices is experienced and this change causes a current change which detracts from the signal current being fed to the sense amplifier input device. That is, when the sense amplifier's input biasing devices are biased in the linear region, a change of state of a signal on the data line will cause signal loss due to current variations into the sense amplifier. A small signal equivalent circuit for the sense amplifier contains a current biasing impedance in parallel with an input source impedance. The lower the value of the current biasing impedance, the more signal attenuation by the input signal path transistors.

With the use of the decoder circuit as described in copending application, Ser. No. 065,930, filed June 24, 1987; and entitled "Folded-Cascode Configured Differential Current Steering Column Decoder Circuit", an improvement over the '160 patent is needed to provide a steady state current which does not operate in the linear region.

Referring to FIG. 1, a pair of input/output lines 11 and 12 comprising a data line and its compliment from a memory circuit, is coupled to transistors 13 and 14, respectively. Transistors 13 and 14 are n-channel transistors having their sources coupled to ground and the drains coupled to data lines 11 and 12, respectively. Gates of transistors 13 and 14 are coupled together to a biasing source designated BIAS 2. Data line 11 is coupled to sources of transistors 20 and 21 and compliment data line 12 is coupled to sources of transistors 22 and 23. In the preferred embodiment transistors 20-23 are n-channel transistors. Transistors 20 and 22 comprise one pair of the common gate coupled transistors while transistors 21 and 23 comprise the other pair. Gates of transistors 20-23 are coupled together to biasing signal designated BIAS 1. Transistors 20-23 function as input devices for data line pairs 11 and 12 while transistors 13 and 14 function as pull-down current source devices.

Each of the common gate transistor pairs is coupled to its respective active load circuitry comprised of transistors 30-37. Transistors 30-33 comprise the active load for the pair of transistors 20 and 22, and the active load comprised of transistors 34-37 are for the second common gate pair of transistors 21 and 23. Transistors 30-37 are p-channel devices having their source coupled to Vcc. Drains of transistors 30 and 32 are coupled to the drain of transistor 20 and the drains of transistors 31 and 33, as well as the gates of transistors 32 and 33 are coupled to the drain of transistor 22. In the other transistor circuit, drains of transistors 34 and 36 are coupled to the drain of transistor 23 and the drains of transistors 35 and 37, as well as the gates of transistors 36 and 37, are coupled to the drain of transistor 21. The gates of transistors 30, 31, 34 and 35 are coupled together to a SENSE ENABLE signal which will turn on transistors 30, 31, 34 and 35, therein activating the sense circuit for reading information present on data lines 11 and 12. Transistors 32 and 33 form a current mirror as does transistors 36 and 37.

The data lines 11 and 12 in this instance, are coupled to transistors 20-23 in a cross-coupled balance connection. The biasing signals BIAS 1 and BIAS 2 are each coupled to the gates of its respective transistors 20-23 and 13-14, respectively, for the purpose of biasing these transistors at a predetermined level. Although various biasing schemes can be used to provide the biasing signals of the present invention, the preferred embodiment uses the biasing scheme a shown.

Referring to FIG. 2, is used for the present invention. In FIG. 2 the biasing circuit 40 is comprised of p-channel transistor 41 and a n-channel transistor 42 coupled in series between Vcc and ground. The source of transistor 41 is coupled to Vcc and the source of transistor 42 is coupled to ground. The drains of transistors 41 and 42, as well as the gate of the n-channel transistor 42, are coupled to an output node 43 which supplies the necessary bias level. The gate of transistor 41 is coupled to ground. The bias level is taken at node 43 wherein the voltage of node 43 is determined by:

$$V_{ss} + V_{GS} = V_{ss} + V_{T42} + (V_{GS42} - V_{T42})$$

where $V_{T42}$ is the threshold voltage and $V_{GS42}$ is the gate to source voltage of transistor 42. This biasing scheme of circuit 40 is utilized to provide the biasing signals for the sense amplifier of the present invention. With sizing of transistors 41 and 42, a first circuit 40 is used to provide biasing signal BIAS 1 and a second biasing circuit 40 is utilized to provide biasing signal BIAS 2. BIAS 2 is at a lower voltage than BIAS 1 in order to maintain transistors 13 and 14 in saturation.

In functional terms, data lines 11 and 12 are coupled to a column decoder circuit which is disclosed in a copending application, Ser. No. 065,930; filed June 24, 1987; and entitled "Folded-Cascode Configured Differential Current Steering Column Decoder Circuit". This copending application provides for a specialized decoder circuit which uses a current source for distributing the contents of a given memory cell to the sense amplifier of the present invention. The sense amplifier of the present invention utilizes biasing signal BIAS 2 to bias transistors 13 and 14 in the saturation region and these transistors 13 and 14 operate as current sources, providing bias current to the sense amplifier and also to the column decoder circuit coupled to data lines 11 and 12. Therefore, transistors 13 and 14 operate to provide saturation current not only to the sense amplifier but to the column decoder circuit. Transistors 13 and 14 are biased in the saturation region and operate as current sources due to the appropriate voltage levels present on their gates and on their drain. As stated above, the biasing signal BIAS 2 provides the predetermined bias on the gates of transistors 13 and 14.

The input transistors 20-23 are biased by the biasing signal BIAS 1. The sources of these transistors 20-21 and 22-23 are coupled to the drains of transistors 13 and 14, respectively, and the voltage on the drains of transistor 13 and 14 are set by the bias voltage BIAS 1 on the gate of the input transistors 20-23 and the DC current through these input transistors 20-23 as determined by current from of transistors 13 and 14. By applying a particular bias voltage on the gate of transistors 13 and 14, and to the drains of these transistors 13 and 14 by means of the input transistors 20-23, transistors 13 and 14 operate as saturated current sources for providing current to the sense amplifier, as well as to the column decoder circuit (not shown) coupled on data lines 11 and 12. By functioning as a current source, voltage changes which occur on data lines 11 and 12 when signals are impressed on data lines 11 and 12 do not cause a change in current from current source transistors 13 and 14. Transistors 13 and 14 will continue to source a saturated current and will not detract from an impression of a current signal on data lines 11 and 12. If transistors 13 and 14 had been operating in a linear region, then, when the voltage on data lines 11 and 12 vary, there will be a change in the current through transistors 13 and 14. This difference in the current detracts from the current which is available for signal to the sense amplifier, therein causing a partial loss of the input signal to the sense amplifier.

The common gate transistors 20-23 provide DC level shifting of the signal on lines 11 and 12 from $V_{ss} + V_T$ to approximately one-half Vcc. Therefore, no additional level shifting circuitry is required for the sense amplifier of the present invention. The common gate transistors provide high speed voltage amplification of the signal into the active load current mirrors 32-33 and 36-37, such that when a signal is developed on the data lines 11 and 12, an imbalance is created for the gate to source bias for the differential devices 20-23. This imbalance causes a difference in the current flowing through the device in the sense amplifier. The current mirrors 32-33, and 36-37 perform differential to single ended conversion and have balanced differential outputs centered about one-half Vcc. By developing the output signal symmetrically around one-half Vcc the available power swing is maximized.

The output from the input transistors 20-23 are coupled to its respective driver stage comprised of transistors 50-57. Signal from the drain of transistor 20 is coupled to node 44 at the junction of the gates of transistors 52, 53 and through transistors 50 and 51 to output node 47. Node 47 is also coupled to the drains of transistors 52 and 53. Transistors 52 and 53 are coupled in series between Vcc and ground, transistor 52 being a p-channel device and transistor 53 being a n-channel device. Similarly, transistors 54–57 are coupled equivalently, wherein the output of the drain of transistor 23 is coupled to node 45 and through transistor 54 and 55 to output node 46. The gates of transistors 56 and 57 are also coupled to node 45. Transistor 56 and 57 are coupled in series between Vcc and ground, wherein transistor 56 is a p-channel device and transistor 57 is a n-channel device. The drains of transistors 56 and 57 are coupled together at output node 46.

The gates of transistor 50, 51, 54 and 55 are coupled together to a PRECHARGE signal. The gates of p-channel transistors 51 and 55 are coupled to the PRECHARGE signal and gates of n-channel transistors 52 and 56 are coupled to the compliment of the PRECHARGE signal. The compliment is provided by inverter 49. The PRECHARGE activates transistors 50–51 and 54–55 for precharging output nodes 46 and 47, respectively. The inverter circuit, comprised of transistors 52, 53, 56 and 57, as shown, is precharged to the trip point whenever a read is to occur such that the voltage transition for passing a signal from node 44 to 47 and 45 to 46 requires reduced access time since the time to move each of these nodes has been preset by a trip point such that a much more rapid transition can occur.

When transistors 50, 51, 54 and 55 are turned on by the PRECHARGE signal. Then transistors 52, 53, 56 and 57 have their output nodes 47 and 46 shorted to their input nodes 44 and 45, respectively, so that each inverter will be biased at their trip point or region of high voltage amplification. Therefore, the trip point is set each time the PRECHARGE signal turns on 50, 51, 54 and 55.

After the precharging cycle, transistors 50, 51, 54 and 55 are turned off and the sensed signal at nodes 44 and 45 activates one of transistors 52 or 53, and 54 or 55, respectively.

Thus, a constant current biased common gate differential sense amplifier is described.

I claim:

1. A FET sense amplifier for sensing a pair of data lines coupled to a memory comprising:
    a first and second common gate transistors of a first conductivity type, wherein an input terminal of said first transistor is coupled to a first of said data lines and an input terminal of said second transistor is coupled to a second of said pair of data lines;
    a third and fourth common gate transistors of said first conductivity type, wherein an input terminal of said third transistor is coupled to said first date line and a input terminal of said fourth transistor is coupled to said second data line;
    said first, second, third and fourth common gate transistors having their gates coupled together to a first reference voltage source;
    a fifth and sixth transistors having their gates coupled to a second reference voltage source, wherein one terminal of said fifth transistor is coupled to said first data line and said input terminals of said first and third transistors;
    and one terminal of said sixth transistor is coupled to said second data line and said input terminals of said second and fourth transistors;
    a first active load coupled to output terminals of said first and second transistors;
    a second active load coupled to output terminals of said third and fourth transistors;
    said first reference voltage source biasing gates of said fifth and sixth transistors to operate in a saturation region;
    said second reference voltage source biasing said first, second, third and fourth transistors, wherein these four said common gate transistors conduct to bias said one terminals of said fifth and sixth transistors such that conduction of said four common gate transistors also biases said fifth and sixth transistors to operate in said saturation region;
    said fifth and sixth transistors operating in said saturation region to function as a current source to said common gate transistors, wherein voltage changes on said data lines are compensated by said current source transistors to prevent signal loss;
    whereby an improved sense amplifier is achieved.

2. The sense amplifier of claim 1 wherein said first active load converts differential inputs to said first and second transistors to a first single-ended output;
    and said second active load converts differential inputs to said third and fourth transistors to a second single-ended output;
    said first and second single-ended outputs providing a balanced differential output representative of signals present on said first and second data lines.

3. The sense amplifier of claim 2 further including a first driver stage coupled to said first active load and a second driver stage coupled to said second active load wherein each said driver stage for respectively amplifying said single-ended outputs of said active loads and providing an amplified balanced differential output representative of signals present on said data lines.

4. The sense amplifier of claim 3 wherein said first and second active loads are comprised of transistors having a second conductivity type.

5. The sense amplifier of claim 4 wherein said first, second, third and fourth common gate transistors are comprised of n-channel devices, and said first and said second active loads are comprised of p-channel transistors.

6. The sense amplifier of claim 5 wherein said fifth and sixth transistors are comprised of n-channel devices.

7. The sense amplifier of claim 6 wherein each of said first and second active loads further includes transistors disposed to function as a current mirror for providing said conversion of differential inputs to said single-ended output.

8. A FET sense amplifier for sensing a pair of data lines coupled to a memory comprising:
    a first and second common gate n-channel transistors, wherein source of said first transistor is coupled to a first of said pair of data lines and source of said second transistor is coupled to a second of said pair of data lines;
    a third and fourth common gate n-channel transistors, wherein source of said third transistor is coupled to said first data line and source of said fourth transistor is coupled to said second data line;
    said first, second, third and fourth transistors having their gates coupled together to a first reference voltage source;
    a fifth and sixth n-channel transistors having their gates coupled to a second reference voltage source, wherein drain of said fifth transistor is coupled to said first data line and source of said first and third transistors; drain of said sixth transistor is coupled to said second data line and sources of said second and fourth transistors; gates of said fifth and sixth transistors are coupled to a second reference voltage source; and sources of said fifth and sixth transistors coupled to a return of a voltage supply source;

a first active load coupled to drains of said first and second transistors;

a second active load coupled to drains of said third and fourth transistors;

said first reference voltage source biasing gates of said fifth and sixth transistors to operate in a saturation region;

said second reference voltage source biasing said first, second, third and fourth transistors, wherein these four said common-gate transistors conduct to bias drains of said fifth and sixth transistors, such that conduction of said four common-gate transistors also bias said fifth and sixth transistors to operate in said saturation region;

said fifth and sixth transistors operating in said saturation region to function as a current source to said common gate transistors, wherein voltage changes on said data lines are compensated by said current source transistors to prevent signal loss;

whereby an improved sense amplifier is realized.

9. The sense amplifier of claim 8 wherein said first active load is comprised of a plurality of p-channel transistors and said second active load is also comprised of a plurality of p-channel transistors.

10. The sense amplifier of claim 9 wherein said first active load is coupled between drains of said first and second transistors and said supply voltage; and said second active load is coupled between drains of said third and fourth transistors and said supply voltage.

11. The sense amplifier of claim 10 wherein said first active load converts differential inputs to said first and second transistor to a first single-ended output, and said second active load converts differential inputs to said third and fourth transistors to a second single-ended output, wherein said first and second single-ended outputs provide a balanced differential output from said sense amplifier.

12. The sense amplifier of claim 11 further including a first and second driver, wherein said first driver is coupled to said first active load for providing a first amplified output of said first single-ended output, and said second driver is coupled to said second active load for providing a second amplified output of said second single-ended output, such that said first and second amplified outputs provide an amplified balanced differential output from said sense amplifier.

13. The sense amplifier of claim 12 wherein each of said first and second active loads further includes a current mirror to provide said conversion.

14. The sense amplifier of claim 13 wherein said first active load is comprised of seventh, eighth, ninth and tenth transistors, wherein said seventh and tenth transistors are coupled between drain of said first transistor and said supply voltage, said eighth and ninth transistors coupled between drain of said second transistor and supply voltage, and said seventh and eighth transistors operating as said current mirror;

said second active load is comprised of eleventh, twelfth, thirteenth and fourteenth transistors, said eleventh and thirteenth transistors are coupled between drain of said third transistor and said supply voltage, said twelfth and fourteenth transistors are coupled between said fourth transistor and said supply voltage, and said eleventh and twelfth transistors operating as said current mirror.

15. The sense amplifier of claim 14 wherein gates of said ninth, tenth, thirteenth and fourteenth transistors are coupled together to a sense enable signal such that said first and second active loads are activated by said sense enable signal.

16. The sense amplifier of claim 15 wherein said first single-ended output is derived from drain of said first transistor and said second single-ended output is derived from drain of said fourth transistor.

17. The sense amplifier of claim 16 wherein said first and second voltage sources have a voltage potential of a value between Vcc and its return.

18. The sense amplifier of claim 17 wherein said amplified balanced differential output is centered approximately at one-half of said supply voltage.

19. The sense amplifier of claim 18 wherein said first and second drivers are precharged prior to amplifying said first and second single-ended outputs.

20. The sense amplifier of claim 19 wherein said plurality of said transistors of said first and second active loads are p-channel devices.

* * * * *

UNITED STATES PATENT AND TRADEMARK OFFICE
CERTIFICATE OF CORRECTION

PATENT NO. : 4,888,503

DATED : 12/19/89

INVENTOR(S) : Young

It is certified that error in the above-identified patent and that said Letters Patent is hereby corrected as shown below:

col. 05, line 51    delete "date"    insert --data--

Signed and Sealed this

Thirtieth Day of April, 1991

Attest:

HARRY F. MANBECK, JR.

*Attesting Officer*    *Commissioner of Patents and Trademarks*